United States Patent
Liou et al.

(10) Patent No.: US 10,163,659 B1
(45) Date of Patent: Dec. 25, 2018

(54) FIN-TYPE FIELD EFFECT TRANSISTOR AND METHOD OF FORMING THE SAME

(71) Applicant: United Microelectronics Corp., Hsinchu (TW)

(72) Inventors: En-Chiuan Liou, Tainan (TW); Yu-Cheng Tung, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/654,552

(22) Filed: Jul. 19, 2017

(51) Int. Cl.
- *H01L 29/78* (2006.01)
- *H01L 21/48* (2006.01)
- *H01L 21/8234* (2006.01)
- *H01L 29/66* (2006.01)

(52) U.S. Cl.
CPC .... *H01L 21/485* (2013.01); *H01L 21/823431* (2013.01); *H01L 29/66795* (2013.01); *H01L 29/785* (2013.01)

(58) Field of Classification Search
CPC ............. H01L 29/66795; H01L 21/485; H01L 21/823431; H01L 29/785
See application file for complete search history.

(56) References Cited

U.S. PATENT DOCUMENTS

| | | | |
|---|---|---|---|
| 7,348,284 B2 | 3/2008 | Doyle et al. | |
| 9,397,169 B2 | 7/2016 | Chen et al. | |
| 2015/0255300 A1* | 9/2015 | He | H01L 21/3088 257/401 |
| 2015/0303194 A1* | 10/2015 | Lee | H01L 27/0886 257/392 |
| 2016/0056277 A1* | 2/2016 | Lee | H01L 29/785 257/401 |
| 2016/0064526 A1* | 3/2016 | Jacob | H01L 29/66795 438/492 |
| 2016/0343585 A1* | 11/2016 | Basker | H01L 27/0924 |
| 2017/0092745 A1* | 3/2017 | Cheng | H01L 29/66795 |
| 2017/0365658 A1* | 12/2017 | Cheng | H01L 29/6653 |

* cited by examiner

*Primary Examiner* — Nathan W Ha
(74) *Attorney, Agent, or Firm* — J.C. Patents

(57) ABSTRACT

A FinFET and a method of forming the same are provided. The FinFET includes a substrate, a buffer layer, an insulating layer, a fin and a gate. A buffer layer is disposed over the substrate, and includes a recess without penetrating the buffer layer. The insulating layer is disposed over the buffer layer, and includes a plurality of isolation structures and a trench between the isolation structures. The fin is disposed in the recess of the buffer layer and the trench of the insulating layer. The gate is disposed across the fin.

20 Claims, 3 Drawing Sheets

FIN-TYPE FIELD EFFECT TRANSISTOR AND METHOD OF FORMING THE SAME

BACKGROUND OF THE INVENTION

Field of the Invention

The invention relates to a semiconductor structure and a method of forming the same, and particularly relates to a fin-type field effect transistor (FinFET) and a method of forming the same.

Description of Related Art

With rapid progress of semiconductor processing techniques, it has been necessary to continuously reduce dimensions of circuit elements and increase the integration of the elements in order to improve speed and performance of the elements. Currently, a three-dimensional multiple-gate structure such as a FinFET, for example, has been developed for replacing a complementary metal oxide semiconductor (CMOS) element. The FinFET has a fin portion extending vertically upward from a surface of a substrate and a gate disposed around the fin portion, thereby providing better electric control of a channel of the FinFET.

SUMMARY OF THE INVENTION

Accordingly, the present invention provides a FinFET and a method of forming the same, in which a buffer layer is simultaneously disposed below isolation structures and a fin between the isolation structures.

The present invention provides a FinFET. The FinFET includes a substrate, a buffer layer, an insulating layer, a fin and a gate. A buffer layer is disposed over the substrate, and includes a recess without penetrating the buffer layer. The insulating layer is disposed over the buffer layer, and includes a plurality of isolation structures and a trench between the isolation structures. The fin is disposed in the recess of the buffer layer and the trench of the insulating layer. The gate is disposed across the fin.

According to an embodiment of the present invention, a thickness of the buffer layer under the fin is less than a thickness of the buffer layer under the isolation structures.

According to an embodiment of the present invention, a depth of the recess ranges from 30 angstroms to 50 angstroms.

According to an embodiment of the present invention, a thickness of the buffer layer ranges from 60 angstroms to 100 angstroms.

According to an embodiment of the present invention, the recess is aligned with and has a same size of the trench.

According to an embodiment of the present invention, the fin protrudes from the insulating layer.

According to an embodiment of the present invention, a material of the buffer layer is different from a material of the fin and a material of the substrate.

According to an embodiment of the present invention, a material of the buffer layer includes at least one of Ge, SiGe, InP, InAs, GaSb, GaAs, AlSb, GaAsP, InGaAs, InGaP, InGaSb, InAlAs, AlGaSb, AlAsSb or a combination thereof.

According to an embodiment of the present invention, the buffer layer includes multiple layers.

The present invention further provides a method of forming a FinFET. A buffer layer is formed over a substrate. An insulating layer is formed over the buffer layer. An opening is formed in the insulating layer and the buffer layer without penetrating the buffer layer. A fin is formed in the opening. A gate is formed across the fin.

According to an embodiment of the present invention, the step of forming an opening includes the following steps. A portion of the insulating layer is removed, so as to form a trench penetrating the insulating layer. By using the insulating layer having the trench as a mask, a portion of the buffer layer is removed, so as to form a recess without penetrating the buffer layer.

According to an embodiment of the present invention, the recess is aligned with and has a same size of the trench.

According to an embodiment of the present invention, the step of removing a portion of the buffer layer is performed by using a mixed gas containing a stop etching gas and an etching gas, the stop etching gas includes carbon (C) and fluoride (F), and the etching gas includes silicon (Si) and chloride (Cl).

According to an embodiment of the present invention, the stop etching gas is selected from a group consisting of $CF_4$, $C_2F_6$, $C_3F_8$, $CHF_3$, $CH_2F_2$ and $CBrF_3$.

According to an embodiment of the present invention, the etching gas is selected from a group consisting of $SiCl_4$, $SiH_2Cl_2$ and $SiHCl_3$.

According to an embodiment of the present invention, the mixed gas further includes a rare gas selected from a group consisting of He, Ne, Ar, Kr, Xe and Rn.

According to an embodiment of the present invention, the step of forming a fin includes epitaxially growing the fin on the buffer layer exposed by the opening.

According to an embodiment of the present invention, the fin is formed as protruding from the insulating layer.

According to an embodiment of the present invention, a material of the buffer layer is different from a material of the fin and a material of the substrate.

According to an embodiment of the present invention, a material of the buffer layer includes a least one of Ge, SiGe, InP, InAs, GaSb, GaAs, AlSb, GaAsP, InGaAs, InGaP, InGaSb, InAlAs, AlGaSb, AlAsSb or a combination thereof.

In view of the above, in the FinFET of the present invention, by forming recesses in the buffer layer without penetrating the buffer layer, the buffer layer is simultaneously disposed below isolation structures and fins between the isolation structures. In detail, the fin is disposed in the recess of the buffer layer, that is, the fin may be grown in the recess of the buffer layer, and thus compared with directly grown on the substrate, the fin may be grown more easily. In addition, the buffer layer is formed before forming the fins, and thus the buffer layer may have a good uniformity. Therefore, the process of forming the FinFET can be simplified and efficient, and the FinFET may have an improved performance.

Several exemplary embodiments accompanied with figures are described in detail below to further describe the present invention in details.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
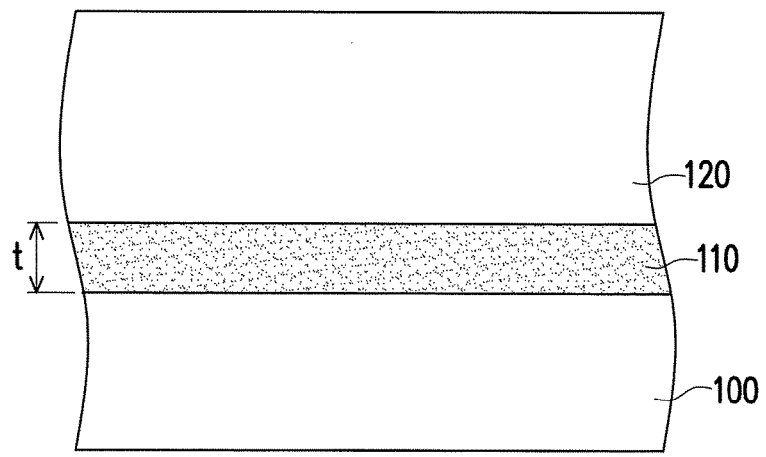
FIG. 1A to FIG. 1E are schematic perspective views of a method of forming a FinFET according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A to FIG. 1E are schematic perspective views of a method of forming a FinFET according to an embodiment of the present invention.

Referring to FIG. 1A, a buffer layer 110 is formed over a substrate 100. The substrate 100 can be a semiconductor substrate, and includes Si, SiGe, Ge, SiC, InAs, InP, GaSb, GaAs, GaAsSb, the like or a combination thereof. A material of the buffer layer 110 is different from the substrate 100. In an embodiment, the buffer layer 110 includes at least one of Ge, SiGe, InP, InAs, GaSb, GaAs, AlSb, GaAsP, InGaAs, InGaP, InGaSb, InAlAs, AlGaSb, AlAsSb, the like or a combination thereof, and the forming method thereof includes performing a suitable deposition process such as chemical vapor deposition (CVD). In an embodiment, the buffer layer 110 may be a single layer or include multiple layers. A thickness t of the buffer layer 110 ranges from 60 angstroms to 100 angstroms, for example.

Then, an insulating layer 120 is formed over the buffer layer 110. In an embodiment, a material of the insulating layer 120 may be oxide (such as a silicon oxide), nitride (such as a silicon nitride), the like or a combination thereof; and the forming method thereof includes performing a suitable deposition process such as CVD, a thermal oxidation, the like or a combination thereof.

Figure 1B:
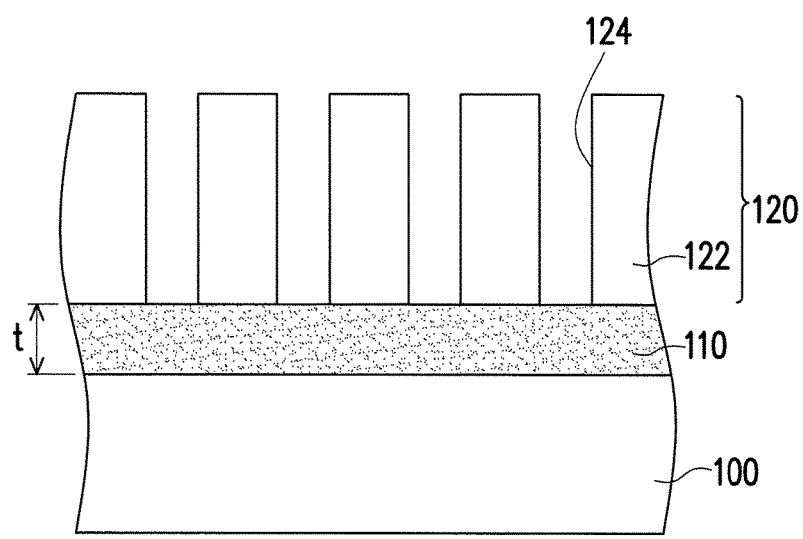

Referring to FIG. 1B, at least one trench 124 is formed in the insulating layer 120. The method of forming the trench 124 includes removing a portion of the insulating layer 120 by a suitable photolithographic and etching technique such as reactive ion etching (RIE), a sputter etch, capacitively coupled plasma (CCP), inductively coupled plasma (ICP), or the like. In an embodiment, after forming the trenches 124, a plurality of isolation structures 122 such as shallow trench isolation (STI) structures is formed, and the trenches 124 are disposed between the isolation structures 122. In an embodiment, a thickness of the isolation structure 122 ranges from 500 angstroms to 700 angstroms, for example.

Figure 1C:
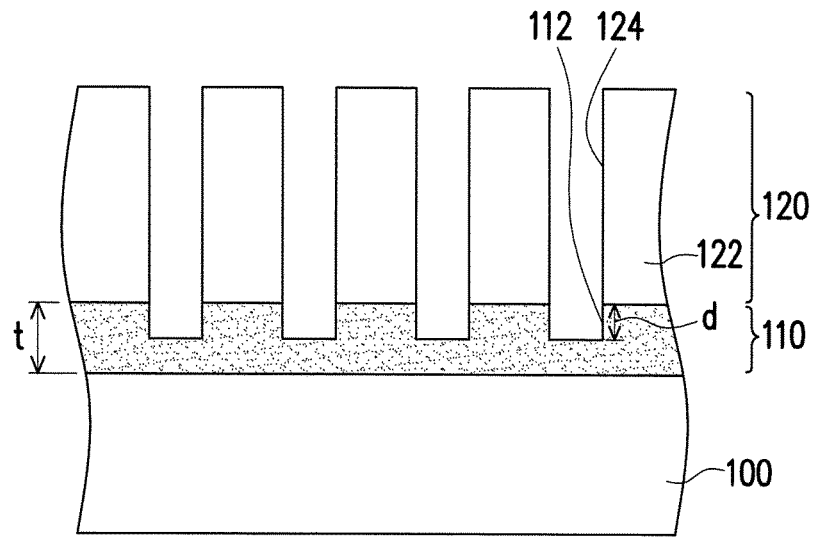

Referring to FIG. 1C, at least one recess 112 is formed in the buffer layer 110 without penetrating the buffer layer 110. The recess 112 is aligned with the trench 124, that is, a size of the recess 112 is substantially the same as a size of the trench 124. In an embodiment, the recess 112 and the trench 124 may be collectively referred to as an opening. In an embodiment, the method of forming the recess 112 includes removing a portion of the buffer layer 110 by using the insulating layer 120 having the trench 124 as a mask. The buffer layer 110 may be removed by a mixed gas containing a stop etching gas and an etching gas. In an embodiment, the stop etching gas may include carbon (C), fluoride (F), the like, or a combination thereof; and the stop etching gas may be selected from a group consisting of $CF_4$, $C_2F_6$, $C_3F_8$, $CHF_3$, $CH_2F_2$, $CBrF_3$, the like, or a combination thereof. The etching gas may include silicon (Si), chloride (Cl), the like, or a combination thereof, and the etching gas may be selected from a group consisting of $SiCl_4$, $SiH_2Cl_2$, $SiHCl_3$, the like, or a combination thereof. In an embodiment, the mixed gas may further include a rare gas selected from a group consisting of He, Ne, Ar, Kr, Xe, Rn, the like, or a combination thereof. In an embodiment, a depth d of the recess 112 ranges from 30 angstroms to 50 angstroms, for example. In another embodiment, the trench 124 and the recess 112 aligned with the trench 124 may be formed simultaneously.

Figure 1D:
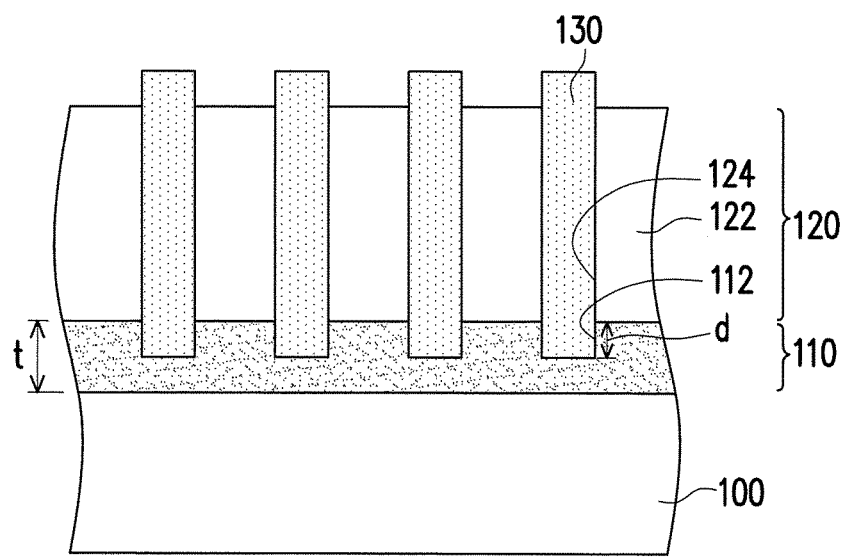

Referring to FIG. 1D, a fin 130 is formed in the recess 112 and the trench 124. In an embodiment, the method of forming the fin 130 includes epitaxially growing the fin 130 on the buffer layer 110 exposed by the recess 112. In an embodiment, the material of the fin 130 may include a group-III, a group-IV, a group-V semiconductor material, or a combination thereof, such as SiGe, InAs, InGaAs, InGaP, AlInSb or the like. The method of forming the fin 130 includes performing an epitaxial growth process such as vapor phase epitaxy (VPE), metal-organic CVD (MOCVD), molecular beam epitaxy (MBE), liquid phase epitaxy (LPE), solid phase epitaxy (SPE) or a suitable epitaxy technique.

In an embodiment, materials of the substrate 100, the buffer layer 110 and the fin 130 are different and lattice constants thereof are matched, and some examples are shown in Table 1 below, but the invention is not limited thereto. In an embodiment, the buffer layer 110 includes a relaxed silicon germanium alloy, and the fin 130 includes a tensile strained silicon such as silicon or a silicon germanium alloy having a germanium content less than the germanium content of the relaxed silicon germanium alloy of the buffer layer 110. Alternatively, the fin 130 includes a compressive strained silicon-containing germanium alloy having a germanium content higher than the germanium content of the relaxed silicon germanium alloy of the buffer layer 110.

TABLE 1

| | | | | | | | | |
|---|---|---|---|---|---|---|---|---|
| Substrate | $Si_xGe_{1-x}$ | InP | GaSb | Ge | GaAs | Si | GaAs | GaAsSb |
| Buffer layer | $Si_yGe_{1-y}$, where y > x | $In_xGa_{1-x}As$, where x > 0.53 | AlSb | $Si_xGe_{1-x}$ | $GaAs_xP_{1-x}$ | GaAs/ InAlAs | AlGaSb/ InGaSb | AlAsSb |
| Fin | $Si_xGe_{1-z}$, where z < x | $In_yGa_{1-y}As$, where y < 0.53 | InAs | $In_yGa_{1-y}As$ | $In_yGa_{1-y}P$, where y > 0.51 | InGaAs | AlInSb | InGaAs |

In an embodiment, the fin 130 extends along a first direction. In an embodiment, the fin 130 protrudes from the insulating layer 120, and a height of the protruded portion of the fin 130 from the top of the insulating layer 120 may be 300 angstroms to 400 angstroms. In another embodiment, a chemical mechanical polishing process can be optionally performed to remove the excess material of the fin 130 outside of the trench 124. In an embodiment, the fin 130 is disposed in the recess 112 of the buffer layer 110 while the isolation structure 122 is formed on the top surface of the buffer layer 110, and thus a thickness of the buffer layer 110 under the fin 130 is less than a thickness of the buffer layer 110 under the isolation structures 122.

Figure 1E:
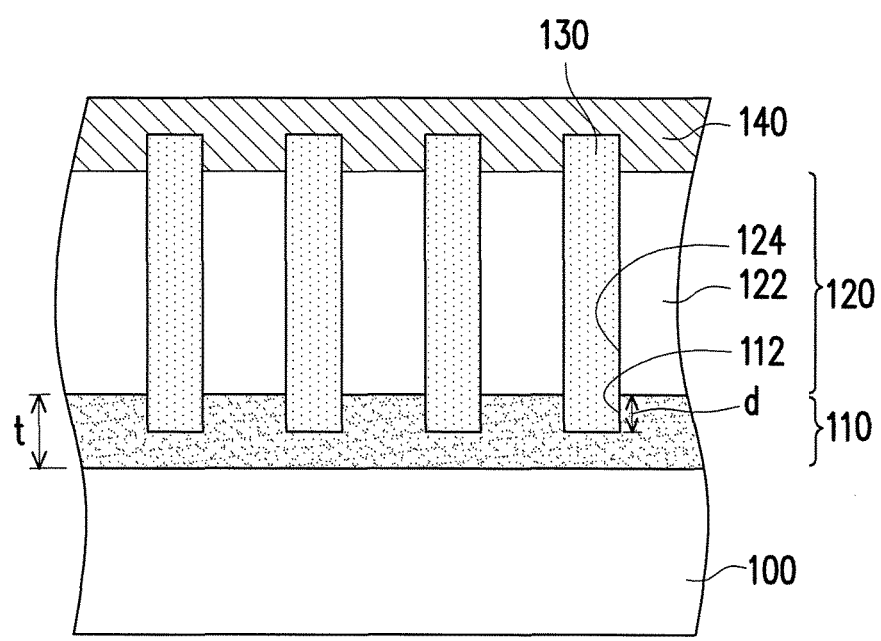

Referring to FIG. 1E, a gate 140 is formed across the fin 130. The gate 140 includes a silicon-containing material or metal. The silicon-containing material includes polysilicon, amorphous silicon or a combination thereof. The metal includes a work function metal (such as TiAl, TiN or the like) and a low-resistance metal (such as Cu, Al, W or the like). In an embodiment, the gate 140 extends in a second direction different from the first direction. For example, the second direction is perpendicular to the first direction. In another embodiment, a gate dielectric layer is disposed between the gate and the fin 130. The gate dielectric layer includes a high-dielectric constant (high-k) layer. The high-k layer includes a dielectric material having a dielectric constant greater than about 7 or even greater than about 10, such as metal oxide. In an embodiment, source/drain regions (not shown) are disposed at two sides of the fin 130. The source/drain regions include epitaxial layers (such as SiGe, SiP or SiC layers) and doped regions (such as N-type or P-type doped regions).

In summary, in the present invention, the recess is formed in the buffer layer without penetrating the buffer layer, and thus the buffer layer is simultaneously disposed below the isolation structures and the fins between the isolation structures. Therefore, the fin may be grown in the recess of the buffer layer rather than directly grown on the substrate, and the fin may be grown more easily. In addition, since the buffer layer is formed before forming the fins, the buffer layer may have a good uniformity. Accordingly, the method of forming the FinFET has simplified steps and reduced cost, and the FinFET may have an improved performance.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A fin-type field effect transistor (FinFET), comprising:
a substrate;
a buffer layer over the substrate, including a recess without penetrating the buffer layer;
an insulating layer over the buffer layer, including a plurality of isolation structures and a trench between the isolation structures;
a fin disposed in the recess of the buffer layer and the trench of the insulating layer; and
a gate, across the fin,
wherein a bottom surface of the gate is in contact with top surfaces of the isolation structures, and separated from the buffer layer by the isolation structures.

2. The FinFET of claim 1, wherein a thickness of the buffer layer under the fin is less than a thickness of the buffer layer under the isolation structures.

3. The FinFET of claim 1, wherein a depth of the recess ranges from 30 angstroms to 50 angstroms.

4. The FinFET of claim 1, wherein a thickness of the buffer layer ranges from 60 angstroms to 100 angstroms.

5. The FinFET of claim 1, wherein the recess is aligned with and has a same size of the trench.

6. The FinFET of claim 1, wherein the fin protrudes from the insulating layer.

7. The FinFET of claim 1, wherein a material of the buffer layer is different from a material of the fin and a material of the substrate.

8. The FinFET of claim 1, wherein a material of the buffer layer comprises at least one of Ge, SiGe, InP, InAs, GaSb, GaAs, AlSb, GaAsP, InGaAs, InGaP, InGaSb, InAlAs, AlGaSb, AlAsSb or a combination thereof.

9. The FinFET of claim 1, wherein the buffer layer comprises multiple layers.

10. A method of forming a FinFET, comprising:
forming a buffer layer over a substrate;
forming an insulating layer over the buffer layer;
forming an opening in the insulating layer and the buffer layer without penetrating the buffer layer;
forming a fin in the opening; and
forming a gate across the fin,
wherein a bottom surface of the gate is formed to be in contact with a top surface of the insulating layer, and separated from the buffer layer by the insulating layer.

11. The method of claim 10, wherein the step of forming an opening comprises:
removing a portion of the insulating layer, so as to form a trench penetrating the insulating layer; and
by using the insulating layer having the trench as a mask, removing a portion of the buffer layer, so as to form a recess without penetrating the buffer layer.

12. The method of claim 11, wherein the recess is aligned with and has a same size of the trench.

13. The method of claim 10, wherein the step of removing a portion of the buffer layer is performed by using a mixed gas containing a stop etching gas and an etching gas, the stop etching gas comprises carbon (C) and fluoride (F), and the etching gas comprises silicon (Si) and chloride (Cl).

14. The method of claim 13, wherein the stop etching gas is selected from a group consisting of $CF_4$, $C_2F_6$, $C_3F_8$, $CHF_3$, $CH_2F_2$ and $CBrF_3$.

15. The method of claim 13, wherein the etching gas is selected from a group consisting of $SiCl_4$, $SiH_2Cl_2$ and $SiHCl_3$.

16. The method of claim 13, wherein the mixed gas further comprises a rare gas selected from a group consisting of He, Ne, Ar, Kr, Xe and Rn.

17. The method of claim 10, wherein the step of forming a fin comprises epitaxially growing the fin on the buffer layer exposed by the opening.

18. The method of claim 10, wherein the fin is formed as protruding from the insulating layer.

19. The method of claim 10, wherein a material of the buffer layer is different from a material of the fin and a material of the substrate.

20. The method of claim 10, wherein a material of the buffer layer comprises a least one of Ge, SiGe, InP, InAs, GaSb, GaAs, AlSb, GaAsP, InGaAs, InGaP, InGaSb, InAlAs, AlGaSb, AlAsSb or a combination thereof.

* * * * *